United States Patent
Lai et al.

(10) Patent No.: US 6,691,079 B1
(45) Date of Patent: Feb. 10, 2004

(54) METHOD AND SYSTEM FOR ANALYZING TEST COVERAGE

(76) Inventors: Ming-chih Lai, 2F, 60 Park Avenue II, Science-Based Ind. Park, Hsinchu (TW); Hsing-ming Juan, 2F, 60 Park Avenue II, Science-Based Ind. Park, Hsinchu (TW)

( * ) Notice: Subject to any disclaimer, the term of this patent is extended or adjusted under 35 U.S.C. 154(b) by 0 days.

(21) Appl. No.: 09/322,185

(22) Filed: May 28, 1999

(51) Int. Cl.⁷ .............................................. G06F 17/50
(52) U.S. Cl. ........................ 703/16; 703/18; 714/738; 716/4
(58) Field of Search ............................. 703/14, 15, 16; 714/738, 739; 716/4, 18

(56) References Cited

U.S. PATENT DOCUMENTS

| | | | | |
|---|---|---|---|---|
| 5,425,036 A | * | 6/1995 | Liu et al. .......................... 371/23 |
| 5,539,680 A | * | 7/1996 | Palnitkar et al. ............. 364/578 |
| 5,604,895 A | * | 2/1997 | Raimi .......................... 395/500 |
| 5,633,879 A | * | 5/1997 | Potts et al. ..................... 371/27 |
| 5,884,023 A | * | 3/1999 | Swoboda et al. ...... 395/183.06 |
| 5,920,830 A | * | 7/1999 | Hatfield et al. .............. 702/119 |
| 6,182,258 B1 | * | 1/2001 | Hollander ................... 714/739 |
| 6,249,891 B1 | * | 6/2001 | Matsumura et al. ........ 714/738 |
| 6,289,491 B1 | * | 9/2001 | Dupenloup .................... 716/5 |
| 6,321,363 B1 | * | 11/2001 | Huang et al. ................... 716/4 |
| 6,363,509 B1 | * | 3/2002 | Parulkar et al. ............ 714/738 |
| 6,449,751 B1 | * | 9/2002 | Hussain et al. ................ 716/4 |

* cited by examiner

*Primary Examiner*—Samuel Broda
*Assistant Examiner*—Thai Phan

(57) ABSTRACT

A method for determining test coverage of an original high level language description which represents an electrical circuit by the data of at least one dump file exported by a simulation program, the original high level description having at least one executable assignment statement which models the circuit, the at least one executable assignment statement having a left side and a right side separated by an assignment operator, the left side being a variable, and the right side being an expression which has a set of at least one variable and at least one logic operator, the expression on the right side, when evaluated, determining a value to be assigned to the variable on the left side, the data of the dump file consisting of the values of all the variables of the originals high level language description between a simulation start time instant and a simulation end time instant the method comprising: a description importing step for importing the original high level language description to form a design database; a dump file importing step for importing the dump file; and a test coverage determining step for determining the test coverage of the original high level language description by the values of the variables at all the time instants from the simulation start time instant to the simulation end time instant.

16 Claims, 7 Drawing Sheets

```
 0:  module example;
 1:    reg clk, sign;
 2:    reg [3:0] pc;
 3:
 4:    always    @(clk)       (E1)
 5:    begin
 6:       pc = pc + 1;
 7:       sign = pc[3];
 8:       @ (posedge clk)     (E11)
 9:          $display("clk rise 1");
10:    end
11:
12:    always                 (E2)
13:       #1 clk = ~clk;      (E21)
14:
15:    initial                (E3)
16:    begin
17:       clk = 0;
18:       pc = 0;
19:    end
```

```
 0: Architecture blk of example is
 1:   signal a,b,c,clk : bit;
 2: begin
 3:   process(a)
 4:     variable v : bit;
 5:   begin
 6:     wait until (clk = '1');
 7:     v := a;
 8:   end process;
 9:
10:   process
11:   begin
12:     wait on clk;
13:     a <= b;
14:     wait for 5 ns;
15:     c <= a;
16:   end process;
17: end architecture blk;
```

(E1) at line 3, (E11) at line 6, (E2) at line 10, (E21) at line 12, (E22) at line 14 cond1  1: If (reset)
       2:     count = 0;
cond2  3: else if (load)
       4:     count = in;
cond3  5: else if (count == 255)
       6:     count = 0;
       7: else
       8:     count = count + 1;

METHOD AND SYSTEM FOR ANALYZING TEST COVERAGE

FIELD OF THE INVENTION

The present invention relates generally to data processing systems, and more particularly, to analyzing the test coverage of an electrical circuit given a plurality of test inputs.

BACKGROUND OF THE INVENTION

In U.S. Pat. No. 5,604,895, a method for inserting computer code into a high level language (HLL) software model of an electrical circuit to monitor test coverage of the software model when exposed to test inputs is disclosed. This method has the following drawbacks: it generates an augmented description code of the electrical circuit by which the test coverage is to be determined and the augmented description code will occupy some computer storage space; executing the augmented description code by a simulation software or hardware tool generates additional dump file(s) that will occupy some additional computer storage space; determining the test coverage will incur the cost of using a simulation software or hardware tool; determining the test coverage by using a simulation software or hardware tool is time consuming; and rerunning the simulation software is necessary if the test coverage of other variables is going to be determined.

To avoid the drawbacks of the prior art method for analyzing the test coverage of a high level language (HLL) software model of an electrical circuit when exposed to test inputs, the inventors of the present invention contemplated that the dump file(s) generated by a simulation software or hardware tool can be used in analyzing the test coverage of a software model when exposed to test inputs.

SUMMARY OF THE INVENTION

It is therefore an object of the present invention to provide a method and system for analyzing the test coverage of a software model when exposed to test inputs, thereby no any additional augmented description code of the electrical circuit under analyzing will be generated and no any additional dump file(s) will be generated.

Another object of the present invention is to provide a method and system for analyzing the test coverage of a software model when exposed to test inputs, thereby there is no need to use a simulation software or hardware tool in analyzing the test coverage.

Yet another object of the present invention is to provide a method and system for analyzing test coverage of a software model when exposed to test inputs, thereby the time consumption in analyzing the test coverage is relatively shorter than that by the prior art method.

To achieve the above and other objects, a method is provided for determining test coverage of an original high level language description which represents an electrical circuit by the data of at least one dump file exported by a simulation program, the original high level description having at least one executable assignment statement which models the circuit, the at least one executable assignment statement having a left side and a right side separated by an assignment operator, the left side being a variable, and the right side being an expression which has a set of at least one variable and at least one logic operator, the expression on the right side, when evaluated, determining a value to be assigned to the variable on the left side, the data of the dump file consisting of the values of all the variables of the original high level language description between a simulation start time instant and a simulation end time instant, the method comprising: a description importing step for importing the original high level language description to form a design database; a dump file importing step for importing the dump file; and a test coverage determining step for determining the test coverage of the original high level language description by the values of the variables at all the time instants from the simulation start time instant to the simulation end time instant.

BRIEF DESCRIPTION OF THE DRAWINGS

The above and other objects and the features and effects of the present invention can be best understood by referring to the following detailed description of the preferred embodiment and the accompanying drawings, wherein:

FIG. 2 (b) shows the event graph that models the small VHDL program shown in FIG. 2(a);

DETAILED DESCRIPTION OF THE PREFERRED EMBODIMENT

In a preferred embodiment of the present invention, event graph(s) and statement tree(s) are used to model an original high level language description which represents an electrical circuit. An event graph is basically a directed graph G(V, E) with hierarchy. In our model, an event is defined as the largest unit of an HDL program that will be executed automatically during simulation. Each Always statement in Verilog or each Process statement in VHDL can create an event graph. Each vertex v ∈ V in an event graph represents an event in the HDL designs. The executable code of each event is also associated with each vertex. Each vertex v may have some child nodes child(v), which means child(v) is generated by v. For example, if we insert the codes of event j into another event i, we can use an @, wait or delay statement (#d) in Verilog design or use a wait on/until/for, or delay statement (after) in VHDL design to separate them. There is some hierarchical relationship between events based on the triggered timing of those events. Each event graph has one candidate event to represent the current triggered point. If the candidate event is triggered, the next lower level event becomes the new candidate event of this event graph.

Figures 1A, 1B:
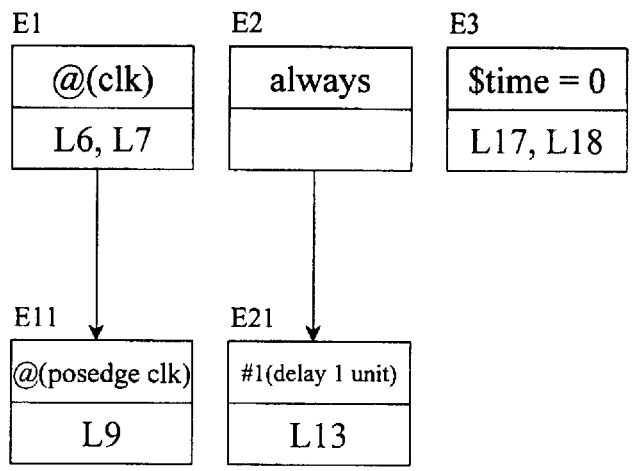
FIG. 1(a) shows a small Verilog program.
FIG. 1(b) shows the event graph that models the small Verilog program shown in FIG. 1(a)
Figures 2A, 2B:
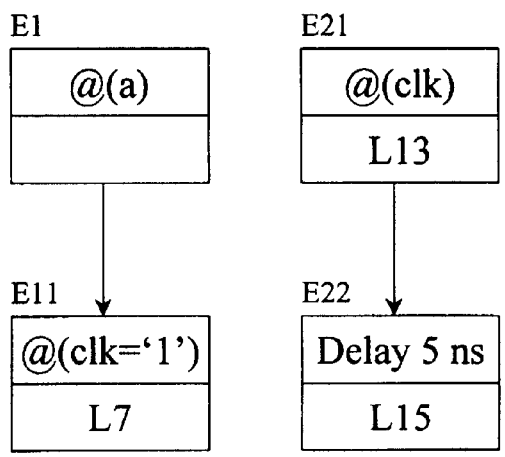
FIG. 2(a) shows a small VHDL program.

Referring now to FIG. 1(a) and FIG. 1(b), according to previous definitions, the Verilog program shown in FIG. 1(a) can be partitioned into five events. Their relationship is built in the event graph shown in FIG. 1(b). The arrows represent their hierarchical relationship. In the initial state, the triggered point of each event graph is on the root event. If the candidate event is triggered, the triggered point moves to the next event. Each vertex in the event graph has two columns. The upper one is the triggering condition of this event, and the lower column is the executable code of this event. In FIG. 1(b), E1, E2, and E3 are root events and they will be triggered at the first time. E11 and E21 are generated from E1 and E2 respectively. E21 will be executed after a constant delay when E2 is executed, so we can set its triggering condition as the absolute time that it will be executed, which can be calculated easily from the current time. We can use the same concept to model a VHDL program into an event graph shown in FIG. 2.

The programs are so simple that we can directly show the executable code of each event in the event graph. In real cases, the executable code of an event could be very complex. Therefore, we use the statement tree to retain the complex actions of each event. A statement tree is a rooted, directed graph with vertex set N containing two types of vertices. A nonterminal vertex n has one or more children child(n) ∈ N. A terminal vertex n, which represents the terminal block in the HDL codes, has no children but a set of assignments, which are recorded in action (n). The entering conditions of each vertex n are recorded in cond(n).

Figures 3A, 3B:
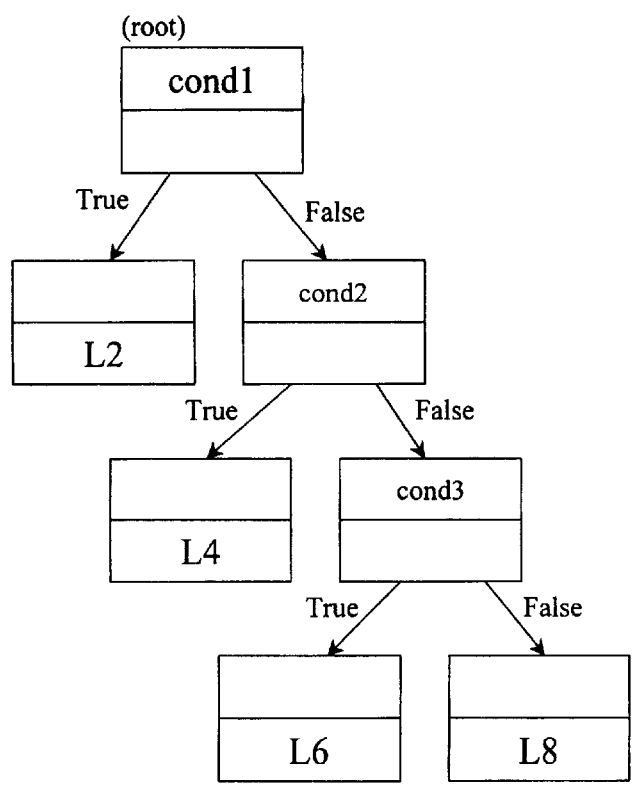
FIG. 3(a) shows a small Verilog program.
FIG. 3(b) shows the statement tree that models the small Verilog program shown in FIG. 3(a)

An example of the statement tree for a piece of Verilog code is shown in FIG. 3. Each vertex in the statement tree has two columns. The upper one is the entering condition cond ( ) of this vertex, and the lower one is the set of executable code action ( ) of this vertex.

From event graph modeling, we can easily know which code will be executed after the event is triggered. For example, in FIG. 1(b), the L6 and L7 statements will be executed once after event E1 is triggered. In an HDL program, if the value of each variable at any time is given, we can know how many times that each event has been triggered and how many times that each statement has been executed.

Dump files, which are often generated in a simulation process, are the log files to trace every change of selected variables of an HDL design. Therefore, if we read a dump file from the beginning of it, we can obtain the value of each variable recorded in the dump file at any time. So, we can know the triggered times of event in the corresponding event graph. It means that we can get the execution count of each statement according to the dump file with properly selected variables. With these statistics, the code coverage can be easily calculated from them.

The Dump-file-based Coverage Analysis algorithm (DUCA) is very similar to a simulation. However, its complexity is much lower. The reasons are as follows. First, the scheduling operation can be skipped in DUCA algorithm. This is the most time-consuming step in a simulation but unnecessary for DUCA algorithm. When an event should occur is clearly recorded in the dump file so that we can just follow the appearing sequence in the dump file to obtain the correct scheduling. Second, many statements can be skipped in DUCA algorithm. We only need to evaluate some events and entering conditions. Our major concern is what code is executed, not the value of each variables. Therefore, the operations whose results do not change the executing codes are skipped. Even if the results of the operations are necessary to decide what code is executed, we could retrieve the results from the dump file if they are assigned as another variables in the HDL program. As a result, only a few operations have to evaluate again in DUCA algorithm, and the computing complexity can be significantly reduced.

As described above, not all information is required to decide what code is executed. In order to improve the efficiency of DUCA algorithm, an analysis should be performed first to find the set of variables that affect the decisions. These are the variables whose changes have to be traced. Actually, they are just the variables appearing in the triggering conditions of each vertex in the event graph or the entering conditions of each vertex in the statement trees. This variable selecting operation also provides the capability of partial code coverage analysis. If the user's concern is only the code coverage of a part of the entire code, we can select only the variables required for this part of code to be traced so that the analysis time can be further r reduced. If the user's concern is on ly the statement has been executed or not, we can skip all evaluations of conditions after those action ( ) has been executed once. This tip can save a lot of time when the dump file is big.

Figure 4:
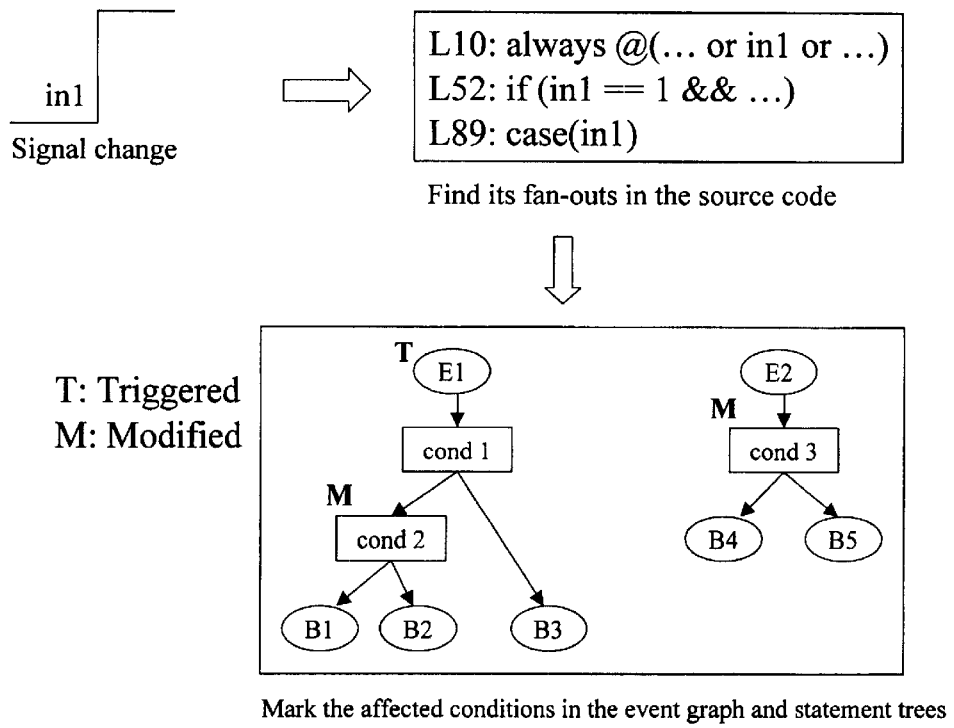
FIG. 4 illustrates the tracing of signal changes.

After the variable selecting step, we can start coverage analysis by just tracing the changes of these signals in the dump file. In order to explain the operations of the coverage analysis more clearly, an example is shown in FIG. 4. Once a signal changes its value in the dump file, we first find the fan-outs of this signal, which are the regions affected by this change, and then mark the associated positions in the event graph and statement trees. If the affected code is the triggering condition in the event graph, we mark it as "Triggered"; if the affected code is the entering condition in the statement trees, we mark it as "Modified". These marks can help us to avoid duplicating computations in the following steps. After all the signal changes at the same time are proceeded, we can traverse the statement trees of the triggered events to decide what code is executed.

Figure 5:
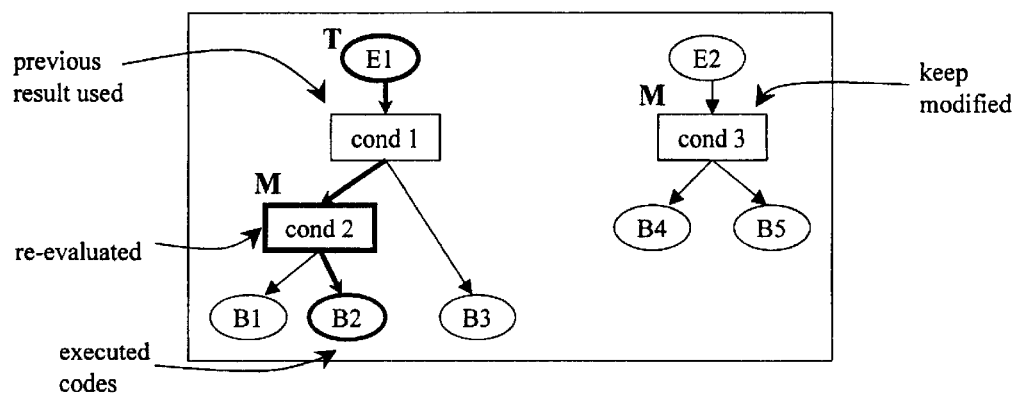
FIG. 5 illustrates the procedure of determining executed statements.

For each triggered event, we have to traverse its statement tree to decide what code is executed as shown in FIG. 5. While traversing down the statement trees, if the current vertex is modified, we have to evaluate the entering condition again to decide which path to go; if not, we can use the previous evaluating result instead to eliminate unnecessary computing. The condition evaluation of the vertices that are marked as modified but not in the traversing paths is also skipped because it is unnecessary now. The "Modified" labels of these vertices are kept until they are finally in the traversing paths.

Under the steps described above, we can obtain the statistics of what code is executed and what the execution count is after traversing the dump file. However, there are many different coverage metrics which require different coverage reports. Therefore, a post-processing step is added to generate the reports for the user-selected coverage metrics.

Figure 6:
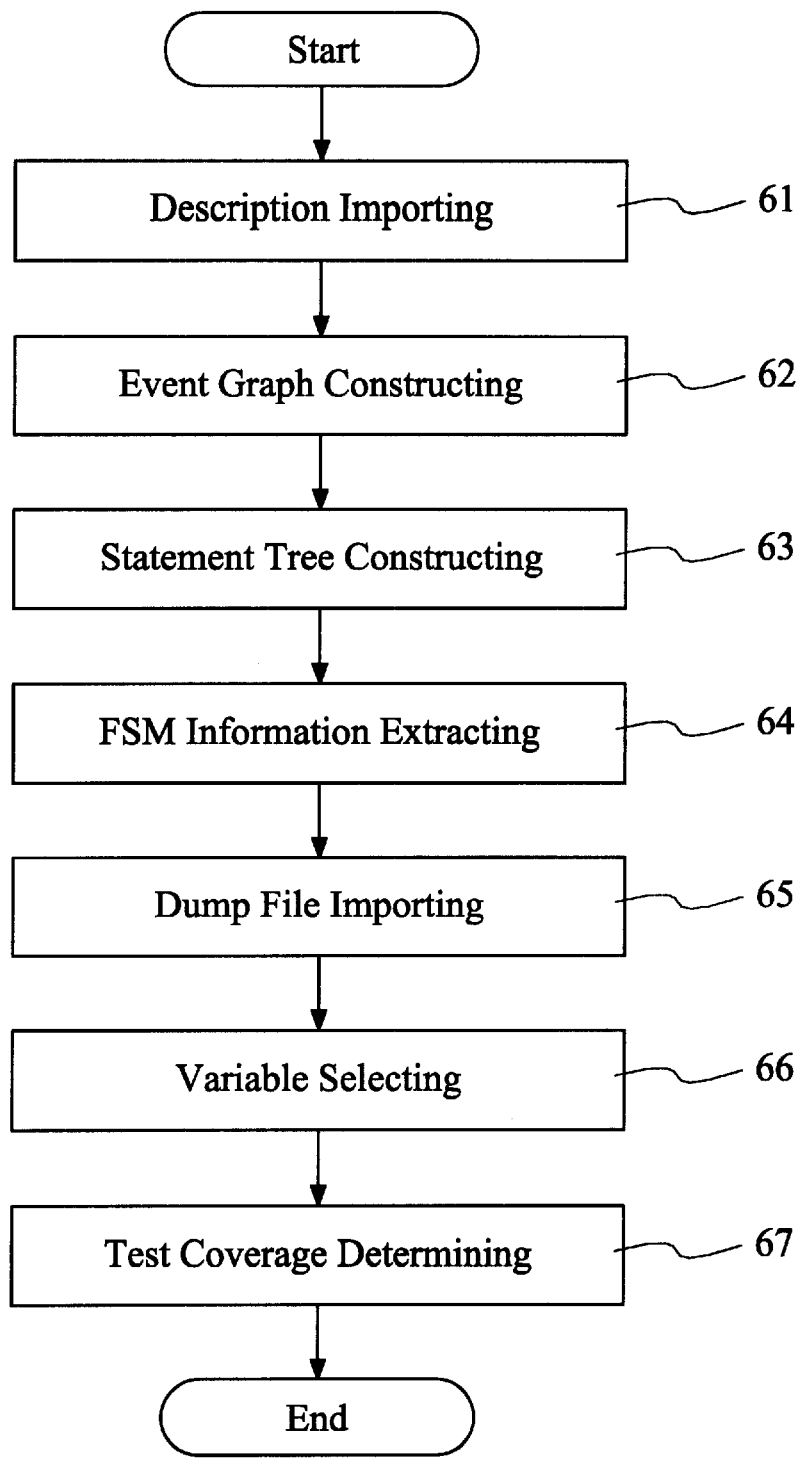
FIG. 6 shows the steps of a preferred embodiment in accordance with the invention.
Figure 7:
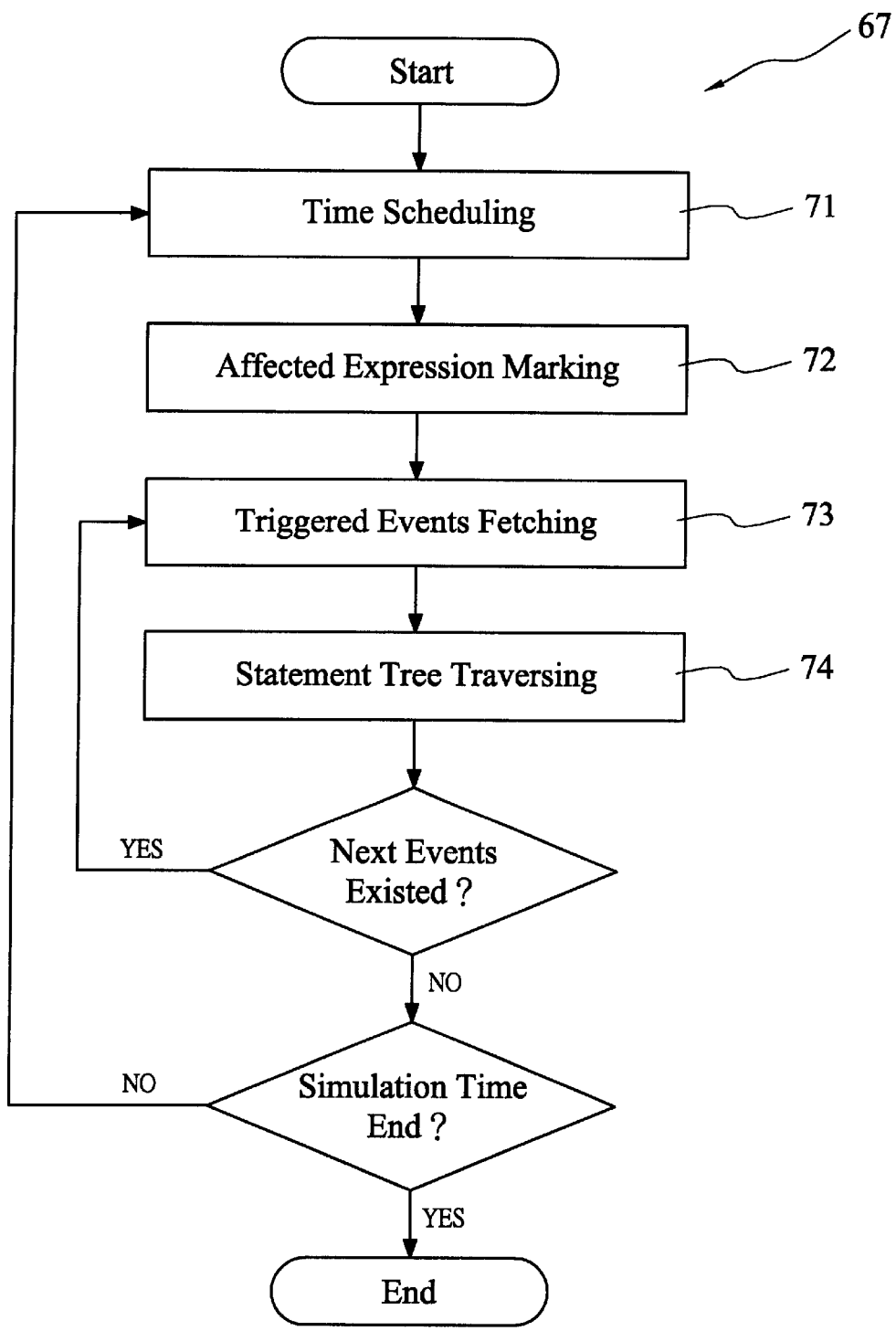
FIG. 7 shows the sub-steps of the test coverage determining step shown in FIG. 6.

Referring to FIG. 6 that illustrates the steps of the method in accordance with a preferred embodiment of the invention, the method comprises a description importing step 61 for importing the original high level language description to form a design database; an event graph constructing step 62 for traversing the design database and finding out the basic event units for constructing event graph(s); a statement tree constructing step 63 for constructing statement tree(s) for the basic event units; an FSM information extracting step 64 for extracting FSM information including transition and state information from the design database and attaching the transition and state information into the statement tree(s); a dump file importing step 65 for importing the dump file; a variable selecting step 66 for selecting, from all the variables, the variables that will trigger at least one of the event units or appear in at least one of the statement tree(s); and a test coverage determining step 67. As shown in FIG.

7, the test coverage determining step 67 comprises a time scheduling step 71, an affected expression marking step 72, a triggered event fetching step 73, a statement tree traversing step 74. The time scheduling step 71 is for monitoring the time instants at a predetermined time increment from the simulation start time instant to the simulation end time instant and creating an iteration cycle for each of the time instants. The affected expression marking step 72 is for marking the condition expression in each statement tree that is affected by the variable(s) selected in the variable selecting step 66 whose value(s) have changed between the time instant corresponding to the cycle and their preceding time instant. The triggered event fetching step 73 is for fetching the event units that are triggered by the variable(s) selected in the variable selecting step 66 whose value(s) have changed between the time instant corresponding to the cycle and their preceding time instant. The statement tree traversing step 74 is for traversing into a basic unit's statement tree so that which condition expression and/or statement has been run can be determined. Thereby, we can get the test coverage data and write it into a test coverage information database.

In other words, an original high level language description having at least one executable assignment statement is analyzed to obtain the event graph(s) and the statement tree (s) modeling the description. The set of variables to be traced and the values of the variables are decided in the variable selecting step. While finishing all the preparation, we start traversing the dump file to get the execution statistics. Once a time change is read from the dump file, the statement trees of the triggered events are traversed under correct executing sequence between them and decide which statements have been executed. It can find the code executed in the period from the last time change to the time just before now. These execution statistics will be kept in Execution_Stats. After traversing the statement trees, we s tart to read the changed signals from the dump file for next time period. Every signal change will update the associated labels in the event graph (s) and the statement tree(s) so that the executed codes can be correctly decided at next time change. At the end, the coverage reports for the user-selected coverage metrics can be generated by a post-processing routine on the execution statistics.

Figure 8A:
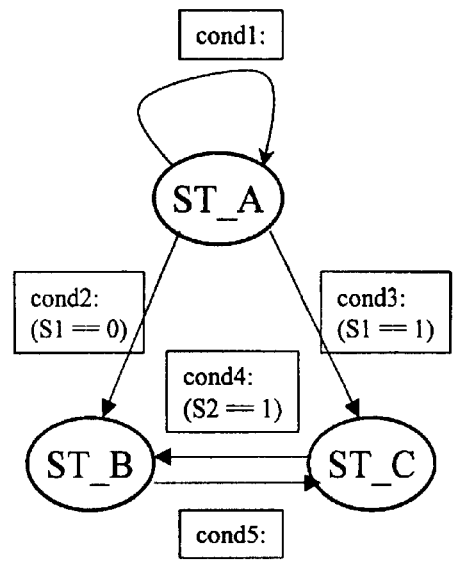
FIG. 8(a) shows a finite state machine graph.
Figure 8B:
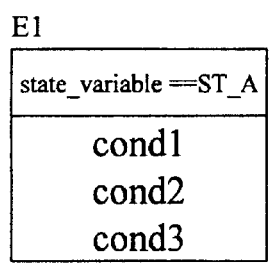
FIG. 8(b) shows an event graph related to FIG. 7(a).
Figure 8B:
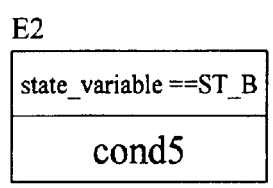
Figure 8B:
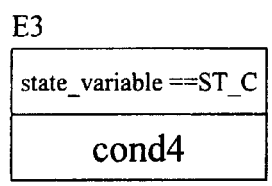

Finite State Machine (FSM) coverage, i.e. state and state transition coverage, is another important coverage metrics for FSM verification. In fact, we can use an event graph to model an FSM. For example, an FSM, shown in FIG. 8(a), has three states and five state transitions. They can be modeled as an event graph shown in FIG. 8(b). It has three events and their state transitions are also associated with corresponding event. We can also use DUCA algorithm to get coverage statistics. The slightly difference is we need to evaluate which condition is TRUE for each event to decide which state transition had been executed when the event had been triggered. For the FSM coverage analysis, we only need to select the state variable(s) to be traced in dump file. If we have extracted FSM in the modeling step, we can also get FSM coverage statistics during one pass of coverage analysis.

Various kinds of test coverage that can be obtained by making use of the invention are cited in the following as examples:

Statement coverage that reports whether each executable statement is encountered.

Branch coverage that reports whether every boolean expressions tested in control structures has evaluated to both TRUE and FALSE.

Condition coverage reports the true or false outcome of each boolean sub-expression, separated by logical-and and logical-or if they occur.

Multiple condition coverage reports whether every possible combination of boolean sub-expressions occurs.

Path coverage reports whether each of the possible paths in each function has been followed.

Toggle coverage reports the bits of logic that have toggled during simulation.

State Machine coverage as described in the foregoing paragraph.

From the above detailed description of the invention, those skilled in the art can easily understand that the objects can be achieved by the preferred embodiment of the invention.

Although a preferred embodiment of the invention has been illustrated and described, it will be obvious to those skilled in the art that various modifications may be made without departing from the scope and spirit of the invention defined by the appended claims.

What is claimed is:

1. A method for determining whether a circuit simulator executed various statements included in a high level language (HLL) program while performing a simulation of an electrical circuit modeled by the HLL program, wherein the statements include a root event statement unconditionally directing the circuit simulator to execute a next one of the statements of the program, statements directing the circuit simulator to set states of variables representing circuit signals, and statements indicating a condition under which program execution is to flow to another statement of the program, and wherein the circuit simulator generated a dump file indicating states of variables controlled by statements as functions of time, the method comprising the steps of:

a. processing the HLL program to generate a directed graph comprising program flow information, a root vertex representing the root event statement, and a plurality of other vertices, each representing a separate other statement of the HLL program, wherein the program flow information indicates directions of HLL program flow between statements represented by the vertices, b. processing the dump file to determine points in simulated time at which a particular variable changed state, and c. identifying which of the vertices of the directed graph represent statements that the circuit simulator executed in order to determine how to set the state of the particular variable at each of the points in simulated time.

2. The method in accordance with claim 1 further comprising the step of:

d. based on the program flow information included in the directed graph, identifying vertices representing statements that must have been executed by the circuit simulator for the circuit simulator prior to executing any statement represented by any vertex identified at step c.

3. The method in accordance with claim 2 further comprising the step of:

e. determining whether a particular vertex of the directed graph generated at step a was identified at either of steps c and d as representing a statement that the circuit simulator executed.

4. The method in accordance with claim 3 further comprising the step of:

f. iteratively repeating steps b through e with a separate variable being selected as the particular variable during each iteration of steps b through e.

5. The method in accordance with claim 2 further comprising the step of:

e. determining whether a particular vertex was identified at step c as representing a statement that the circuit simulator executed, and whether that statement caused the circuit simulator to set the particular variable to each one of its possible states at said points in simulated time.

6. The method in accordance with claim 2 further comprising the step of:

e. iteratively repeating steps b through d with a separate variable being selected as the particular variable for each iteration of steps b through d.

7. The method in accordance with claim 6 wherein one of the statements is a conditional branch statement containing an expression the circuit simulator evaluates to determine a next statement to be executed, and wherein the method further comprises the step of:

f. determining from the program flow information included in the directed graph, whether each vertex of the directed graph representing a statement that may be executed immediately after the conditional branch statement was identified during any iteration step c or d as having been executed by the circuit simulator.

8. The method in accordance with claim 1 wherein one of the statements is a trigger event statement indicating that a condition under which the circuit simulator is to execute a next statement of the program is a next occurrence of an event, and wherein the vertex representing that triggered event statement includes timing information indicating each point in simulated time at which that event occurs.

9. A method for determining which portions of a high level language (HLL) program a circuit simulator executed while performing a simulation of an electrical circuit modeled by the HLL program, wherein the HLL program includes a plurality of event units, each comprising a plurality of statements including a root event statement unconditionally directing the circuit simulator to execute a next statement of the event unit during the simulation, wherein at least one event unit also comprises at least one variable assignment statement directing the circuit simulator to set at least one variable to a particular state determined by evaluating an assignment expression included in the variable assignment statement, wherein at least one event unit comprises at least one conditional branch statement directing the circuit simulator to evaluate a branching expression included in the conditional branch statement to determine another statement of that event unit to next execute, and wherein at least one event unit comprises at least one triggered event statement directing the circuit simulator execute a next statement of the event unit upon a next occurrence of a triggering event identified by the triggering event statement;

wherein the circuit simulator generates a dump file indicating states of variables controlled by the statements of the event units as functions of simulated time, the method comprising the steps of:

a. processing the HLL program to generate for each event unit, a separate directed graph comprising a root vertex representing the root event statement of that event unit, a separate vertex representing each other statement of the event unit, and comprising program flow information indicating directions of HLL program flow between the statements represented by the directed graph's vertices, b. processing the dump file to determine points in said simulated time at which a particular variable changed state, and c. determining which of the vertices of any directed graph generated at step a, represents a statement that must have been executed by the circuit simulator for the circuit simulator to have changed the states of the particular variable any of said points in said simulated time.

10. The method in accordance with claim 9 wherein each vertex representing a triggered event statement includes timing information defining a point in simulated time of each occurrence of a triggering event referenced by the triggered event it represents.

11. The method in accordance with claim 10 wherein step c comprises the substeps of:

c1. identifying each vertex of any directed graph generated at step a representing a statement which, when executed, directed the circuit simulator to set the state of the particular variable at any one of the particular points in simulated time, and c2. identifying any vertex of any directed graph generated at step a which, based on the program flow information included in that directed graph, represents a statement the circuit simulator must have executed in order to have executed a statement represented by any vertex identified at step c1.

12. The method in accordance with claim 10 further comprising the step of:

d. determining whether a particular vertex of any directed graph generated at step a was identified at step c as representing a statement that must have been executed.

13. The method in accordance with claim 10 further comprising the step of:

d. determining whether a particular vertex of any directed graph generated at step a was identified at step c as representing a statement that must have been executed and whether that statement caused the circuit simulator to set the particular variable to each one of its possible states at said points in said simulated time.

14. The method in accordance with claim 13 further comprising the step of:

e. iteratively repeating steps b, c and d with a separate variable being selected as the particular variable for each iteration of steps b, c and d.

15. The method in accordance with claim 10 further comprising the step of:

d. iteratively repeating steps b and c with a separate variable being selected as the particular variable for each iteration of steps b and c.

16. The method in accordance with claim 15 further comprising the step of:

e. determining whether every vertex of a directed graph representing a statement that the program flow information indicates the circuit simulator can execute immediately following a conditional branch statement was identified during at least one iteration of step c.

* * * * *